(12) United States Patent
Chang et al.

(10) Patent No.: US 12,267,072 B2
(45) Date of Patent: Apr. 1, 2025

(54) ELECTRONIC DEVICE AND METHOD FOR AUDIO SIGNAL PROCESSING

(71) Applicant: Elite Semiconductor Microelectronics Technology Inc., Hsinchu (TW)

(72) Inventors: Chih-Sheng Chang, Hsinchu (TW); Isaac Y. Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 281 days.

(21) Appl. No.: 18/125,331

(22) Filed: Mar. 23, 2023

(65) Prior Publication Data

US 2024/0322798 A1 Sep. 26, 2024

(51) Int. Cl.
| | |
|---|---|
| *H03K 3/017* | (2006.01) |
| *H03K 3/037* | (2006.01) |
| *H03K 19/20* | (2006.01) |
| *H04R 3/00* | (2006.01) |
| *H04R 29/00* | (2006.01) |

(52) U.S. Cl.
CPC ............ *H03K 3/017* (2013.01); *H03K 19/20* (2013.01); *H04R 3/00* (2013.01); *H04R 29/001* (2013.01); *H03K 3/037* (2013.01)

(58) Field of Classification Search
CPC ........ H03K 3/017; H03K 3/037; H03K 19/20; H03K 7/08; H04R 3/00; H04R 29/001; H03F 3/183; H03F 2200/339; H03F 2200/351; H03F 3/2173; H03F 2200/03
USPC ......... 381/59, 120, 123; 330/10, 251, 207 A
See application file for complete search history.

(56) References Cited

U.S. PATENT DOCUMENTS

| | | | | |
|---|---|---|---|---|
| 5,497,062 | A * | 3/1996 | Fenstermacher | H02M 3/157 318/599 |
| 6,310,913 | B1 * | 10/2001 | Ishikawa | G06F 1/025 375/238 |
| 9,344,072 | B2 * | 5/2016 | Kim | H03K 5/05 |
| 12,088,267 | B2 * | 9/2024 | Hsu | H02M 3/1582 |
| 2007/0132509 | A1 * | 6/2007 | Mochizuki | H03F 1/26 330/10 |
| 2011/0169679 | A1 * | 7/2011 | Teramoto | H03M 1/0836 341/144 |
| 2018/0204131 | A1 * | 7/2018 | Najafi | G06N 7/01 |
| 2021/0135660 | A1 * | 5/2021 | Lin | H04L 27/20 |

* cited by examiner

*Primary Examiner* — Xu Mei
(74) *Attorney, Agent, or Firm* — Cooper Legal Group LLC (57) ABSTRACT

An electronic device includes a sampling circuit and a summing circuit coupled with the sampling circuit. The sampling circuit samples a pulse width of a first input pulse of a PWM input signal since a first time point on a rising edge of a clock pulse of a clock signal. The summing circuit generates a first output pulse of a PWM output signal since a second time point on a falling edge of the clock pulse. A pulse width of the first output pulse is a summation of the pulse width of the first input pulse and a pulse width of a second input pulse of the PWM input signal, and the second input pulse is the next pulse after the first input pulse.

14 Claims, 6 Drawing Sheets

ELECTRONIC DEVICE AND METHOD FOR AUDIO SIGNAL PROCESSING

BACKGROUND OF THE INVENTION

The present disclosure relates to an electronic device and a method for audio signal processing. More specifically, the present disclosure relates to an electronic device and a method for resolving a "double switching frequency" issue in the ternary mode of a class D amplifier.

Class D amplifier is a type of audio amplifier commonly used in the art for its high efficiency. A class D amplifier can provide two pulse-width modulated (PWM) signals for driving a load (e.g., audio speakers.) The two PWM signals may form a ternary modulation or a quaternary modulation (corresponding to the ternary mode ("T-mode" in short) and quaternary mode ("Q-mode" in short) of the class D amplifier, respectively).

Figure 2:
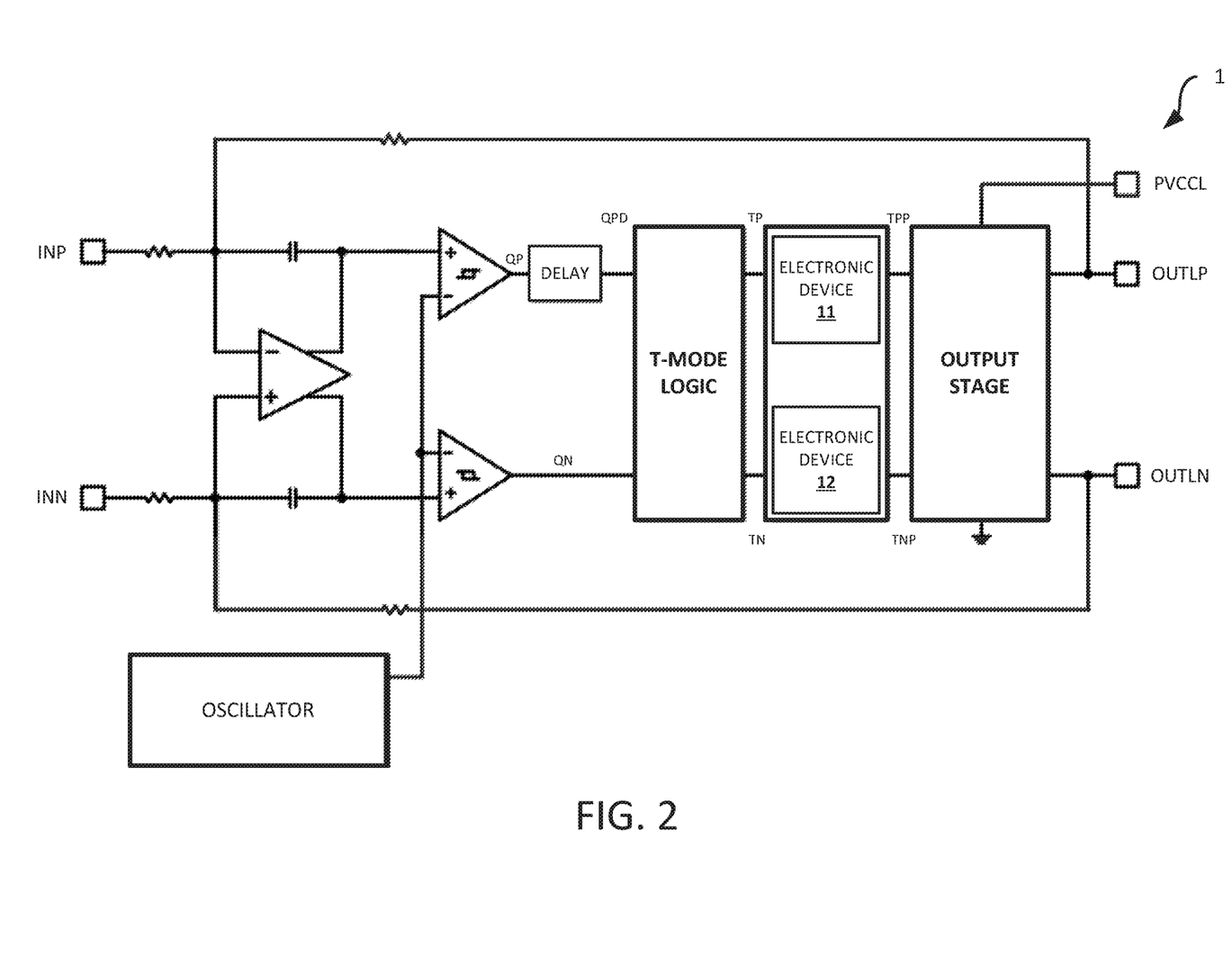
FIG. 2 depicts a schematic view of the electronic devices for audio signal processing according to one or more embodiments of the present disclosure being adopted by an audio system.

The high efficiency of a class D amplifier is due to the "switching" mechanism in its modulation signals. However, when the pulse width of output signal (e.g., the signals provided by output pins OUTLP and OUTLN as shown in FIG. 2, which will be further described in later paragraphs) is large (e.g., the pulse width of the output signals being greater than 200 ns when the idle pulse width equals 100 ns, wherein said idle pulse width refers to the pulse width of output signals when the difference of input signal (e.g., input signals INP and INN as shown in FIG. 2) is zero in T-mode) under T-mode, the switching frequency would be doubled when compared to the case in which said pulse width of output signal is small (e.g., the pulse width of the output signals being less than 200 ns when the idle pulse width is 100 ns).

Figure 1A:
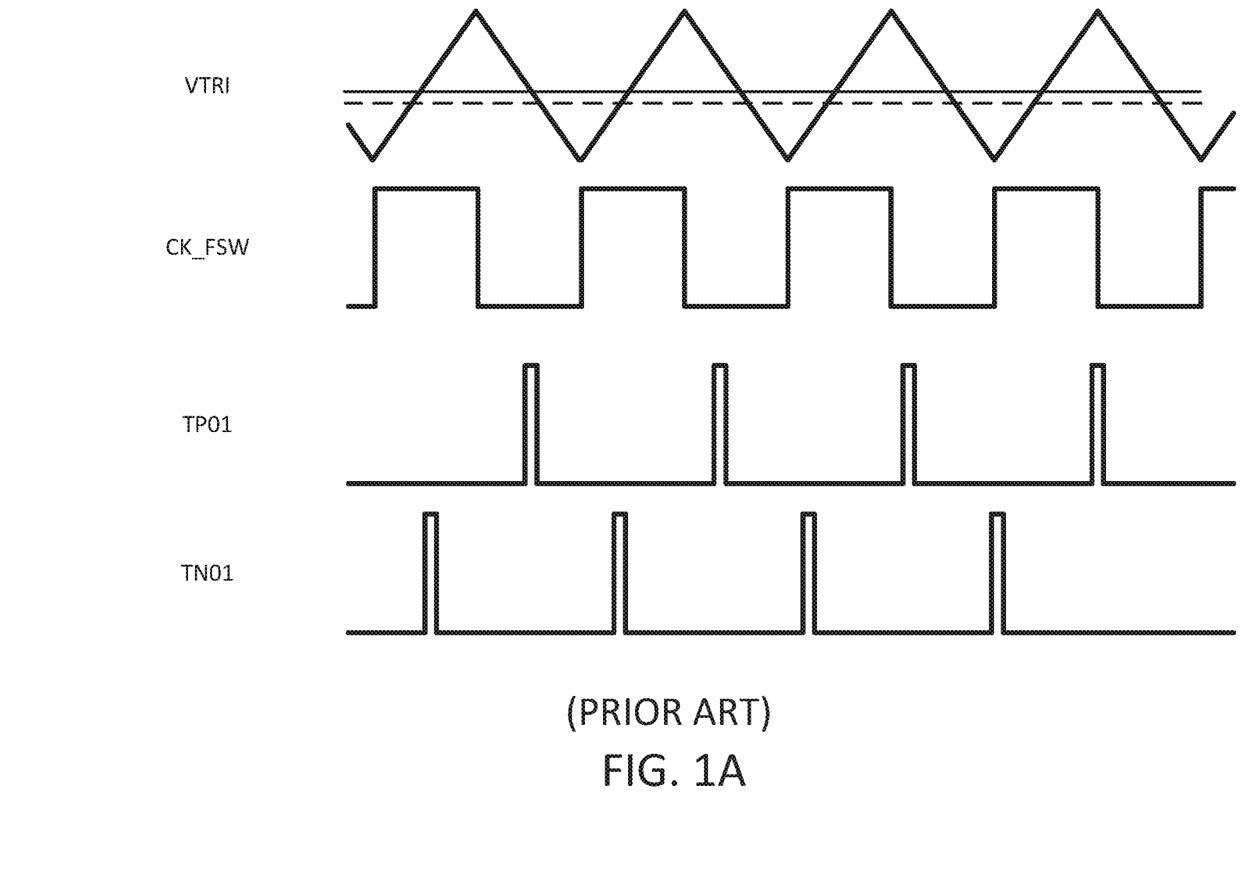
FIG. 1A depicts a schematic view of the PWM signals generated by a class D amplifier when the pulse width of output signal is small.
Figure 1B:
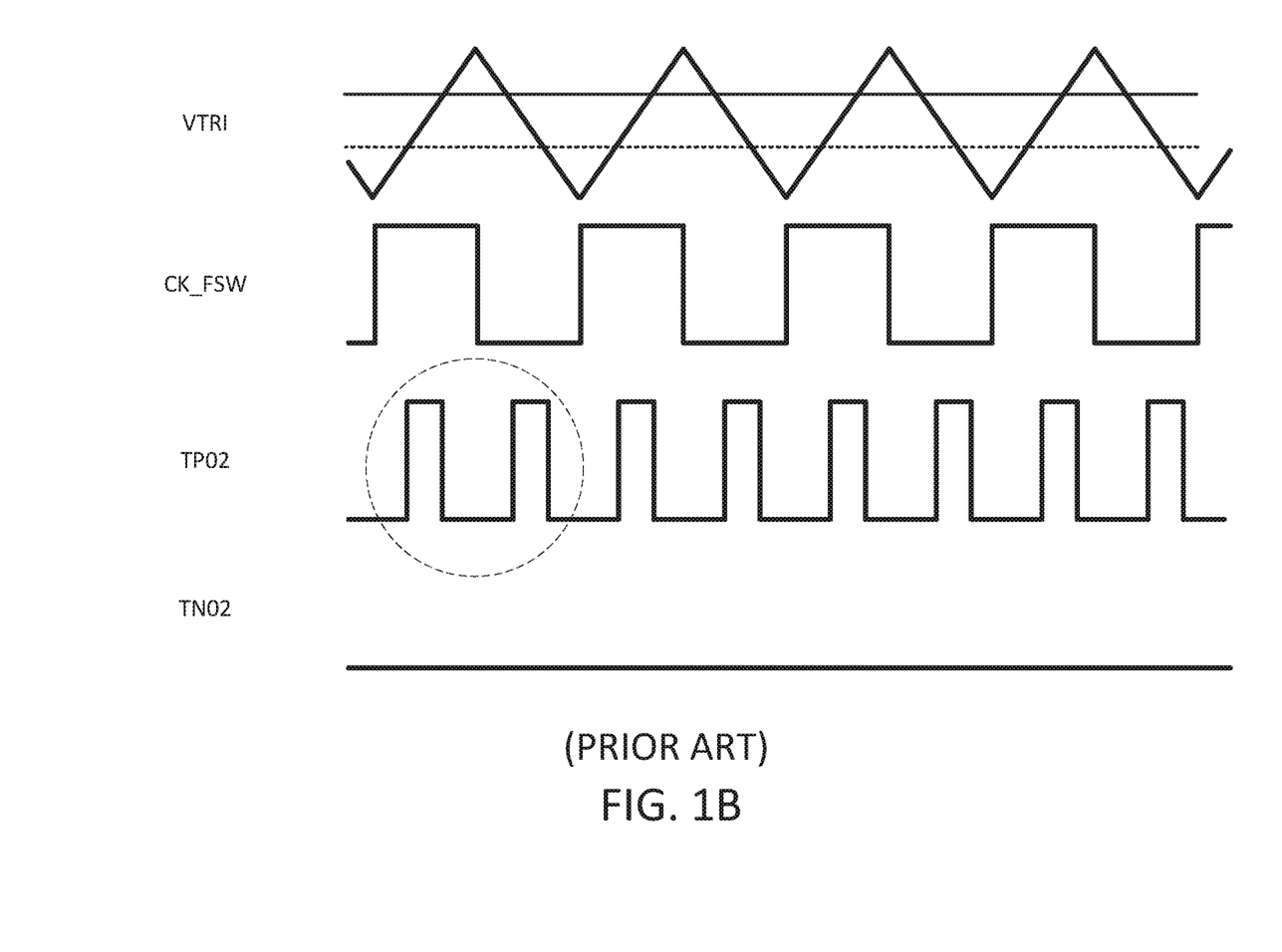
FIG. 1B depicts a schematic view of the PWM signals generated by a class D amplifier when the pulse width of output signal is large.

FIG. 1A depicts a schematic view of the T-mode signals TP01 and TN01 generated by a class D amplifier when the pulse width of output signal is small. FIG. 1B depicts a schematic view of the T-mode signals TP02 and TN02 generated by a class D amplifier when the pulse width of output signal is large. The T-mode signals TP01 and TP02 are signals in the positive rails, whereas the T-mode signals TN01 and TN02 are signals in the negative rails.

Please refer to FIG. 1A and FIG. 1B. Each of the T-mode signals TP01 and TP02 goes up to the high level (which means the class D amplifier would perform a switch between the positive and negative rails) once in each period of a triangle-wave signal VTRI or a clock signal CK_FSW when the pulse width of output signal is small. However, when the pulse width of output signal is large, one of the PWM signals TP02 and TN02 (in this case, the PWM signal TP02) would go up to the high level twice in each triangle wave as shown in FIG. 1B, which leads to twice as many times of switching from the class D amplifier as shown by a dashed circle in FIG. 1B. This situation is called a "double switching frequency" issue. With the switching frequency doubled, the distortion of the output signal (e.g., the electromagnetic interference (EMI) effect) as well as the power consumption (aka, switching loss) are also increased. In view of this, there is an urgent need in the art for overcoming the double switching frequency issue.

SUMMARY OF THE INVENTION

To solve at least the abovementioned problem, the present disclosure provides an electronic device for audio signal processing. The electronic device may at least comprise a first sampling circuit and a first summing circuit coupled with the first sampling circuit. The first sampling circuit may be configured to sample a pulse width of a first input pulse of a PWM input signal since a first time point on a first half of a first pulse period of a clock signal. The first summing circuit may be configured to generate a first output pulse of a PWM output signal since a second time point on a second half of the first pulse period, wherein a pulse width of the first output pulse is a summation of the pulse width of the first input pulse and a pulse width of a second input pulse of the PWM input signal, and the second input pulse is a next pulse after the first input pulse.

To solve at least the abovementioned problem, the present disclosure also provides a method for audio signal processing. The method may comprise steps as follows: (A) sampling, by an electronic device, a pulse width of a first input pulse of a PWM input signal since a first time point on a first half of a first pulse period of a clock signal; and (B) generating, by the electronic device, a first output pulse of a PWM output signal since a second time point on a second half of the first pulse period, wherein a pulse width of the first output pulse is a summation of the pulse width of the first input pulse and a pulse width of a second input pulse of the PWM input signal, and the second input pulse is a next pulse after the first input pulse.

The electronic device and method for audio signal processing provided by the present disclosure can keep the class D amplifier from the double switching frequency issue by combining the two input pulses into one output pulse whose pulse width equals the summation of the pulse widths of the two input pulses. After such an alternation, the overall switching frequency of the class D amplifier corresponding to the output PWM signal is consistent with the frequency of the triangle-wave signal VTRI even if the pulse width is large. Thus, the EMI effect and switching loss can be reduced, and the load driven by the PWM output signal (e.g., a speaker) can remain unaffected by the raise of pulse width of the input signal. In view of this, the electronic device and method provided by the present disclosure indeed solve the abovementioned problem in the art.

This summary overall describes the core concept of the present invention and covers the problem to be solved, the means to solve the problem and the effect of the present invention to provide a basic understanding of the present invention by those of ordinary skill in the art. However, it shall be appreciated that, this summary is not intended to encompass all embodiments of the present invention but is provided only to present the core concept of the present invention in a simple form and as an introduction to the following detailed description. The detailed technology and preferred embodiments implemented for the subject invention are described in the following paragraphs accompanying the appended drawings for people having ordinary skills in the art to well appreciate the features of the claimed invention.

BRIEF DESCRIPTION OF DRAWINGS

The drawings can assist the description of the present disclosure, wherein.

The contents shown in FIGS. 2-4 are only for easily illustrating the embodiments, instead of limiting the scope of the present disclosure.

DETAILED DESCRIPTION OF THE INVENTION

In the following description, an electronic device and a method for audio signal processing provided by the present disclosure will be explained with reference to embodiments thereof. However, these embodiments are not intended to limit the present invention to any environment, applications, or implementations described in these embodiments. Therefore, description of these embodiments is only for purpose of illustration rather than to limit the present invention. It should be appreciated that, in the following embodiments and the attached drawings, elements unrelated to the present invention are omitted from depiction. In addition, dimensions of and dimensional scales among individual elements in the attached drawings are provided only for illustration, but not to limit the scope of the present invention.

FIG. 2 depicts a schematic view of the electronic devices for audio signal processing according to one or more embodiments of the present disclosure being adopted by an audio system. Referring to FIG. 2, an audio system 1 may be configured to generate a pair of Q-mode signals QP and QN based on a pair of input signals INP and INN in cooperation with an oscillator, and further generate a pair of T-mode signals TP and TN based on the Q-mode signals QP and QN.

A delaying mechanism is useful when dealing with small input signals to ensure signal quality, and thus one of the Q-mode signals QP and QN may be delayed in some embodiments. In the case shown in FIG. 2, it is the positive Q-mode signal QP that is delayed by a delaying circuit as a delayed Q-mode signal QPD.

In some ways of implementation, a pair of T-mode signals TP and TN may be derived from the Q-mode signals QP and QN in accordance with the following rules:

$$TP = XOR(QPD * QN) * QPD \quad \text{(Equation 1)}$$

$$TN = XOR(QPD * QN) * QN \quad \text{(Equation 2)}$$

wherein "TP" and "TN" are positive signal and negative signal of the T-mode signals respectively, "QPD" is the delayed positive signal of the Q-mode signals, and "QN" is the negative signal of the Q-mode signals.

However, the aforementioned delaying mechanism would lead to asymmetric pulse widths in one of the T-mode signals (e.g., the T-mode signal TP that has pulses with different pulse widths shown in FIG. 4, which will be further discussed in later paragraphs).

The electronic devices 11 and 12 can eliminate the double switching frequency issue of T-mode signals TP and TN mentioned above, even if the pulse widths in any of the T-mode signals TP and TN are asymmetric, and thus may be adopted by the audio system 1 to generate a pair of T-mode signals TPP and TNP as a refined pair of T-mode signals. The refined signals may then be provided to a pair of output pins OUTLP and OUTLN by an output stage coupled with a power source (e.g., a power supply for left-channel PVCCL as shown in FIG. 2).

The details of how the T-mode logic circuit shown in FIG. 2 generates the T-mode signals TP and TN according to the Q-mode signals QP/delayed Q-mode signals QPD and QN, the delaying mechanism, the cooperating oscillator, and the output stage as mentioned above have all been well-appreciated by a person having ordinary skills in the art, and thus will not be thoroughly elaborated herein. The present disclosure focuses on the electronic devices 11 and 12 (mostly the electronic device 11).

The electronic devices 11 and 12 may be used for processing one of the T-mode signals TP and TN. For example, the electronic device 11 is used for processing the T-mode signal TP to generate the T-mode signal TPP, and the electronic device 12 is used for processing the T-mode signal TN to generate the T-mode signal TNP.

The electronic devices 11 and 12 may be substantially the same, and thus a person having ordinary skills in the art can understand the way, function, and result of the electronic device 12 when processing the T-mode signal TN according to the following descriptions corresponding to the electronic device 11.

Figure 3:
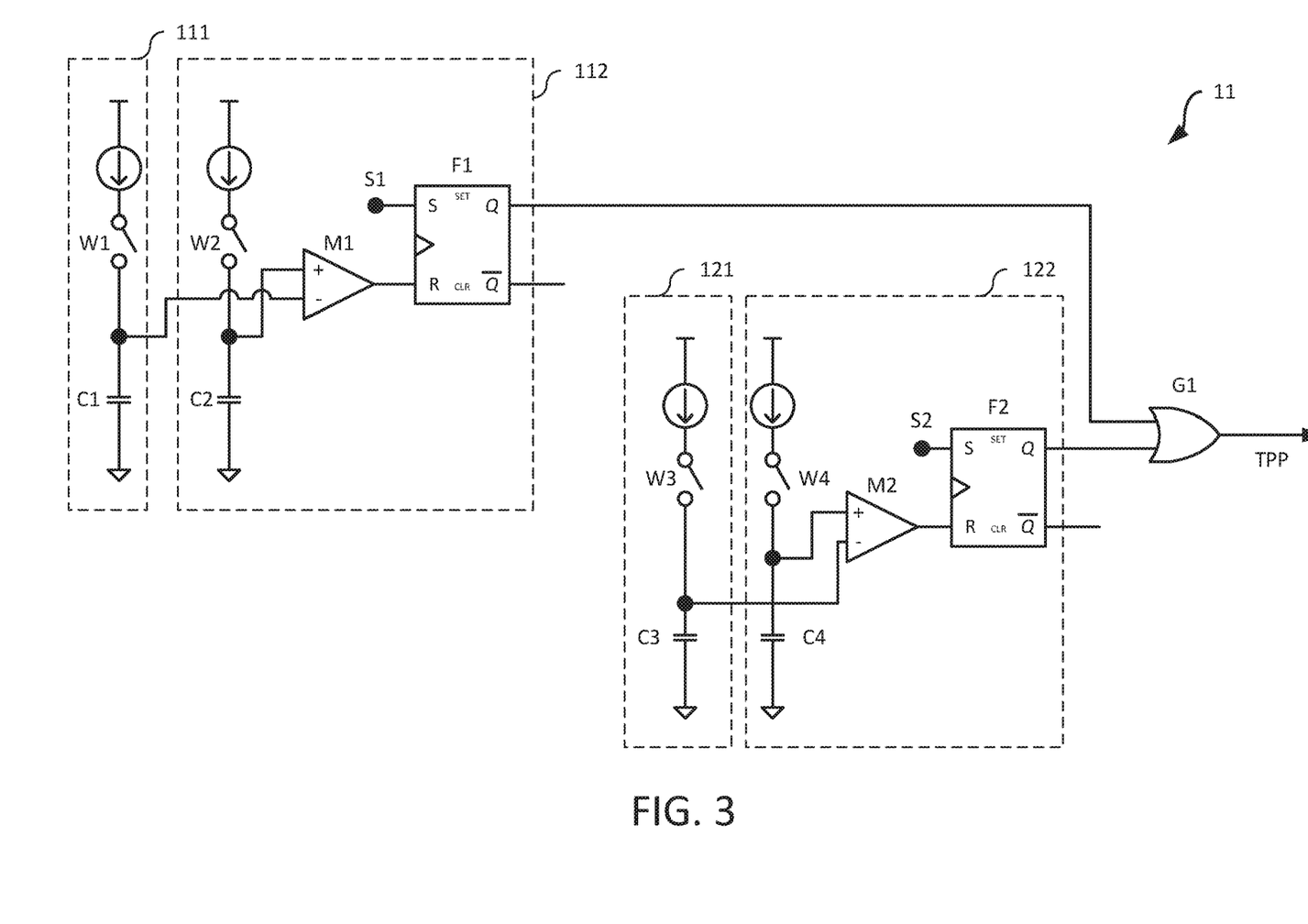
FIG. 3 depicts a schematic view of the sampling circuits and summing circuits of an electronic device according to one or more embodiments of the present disclosure.
Figure 4:
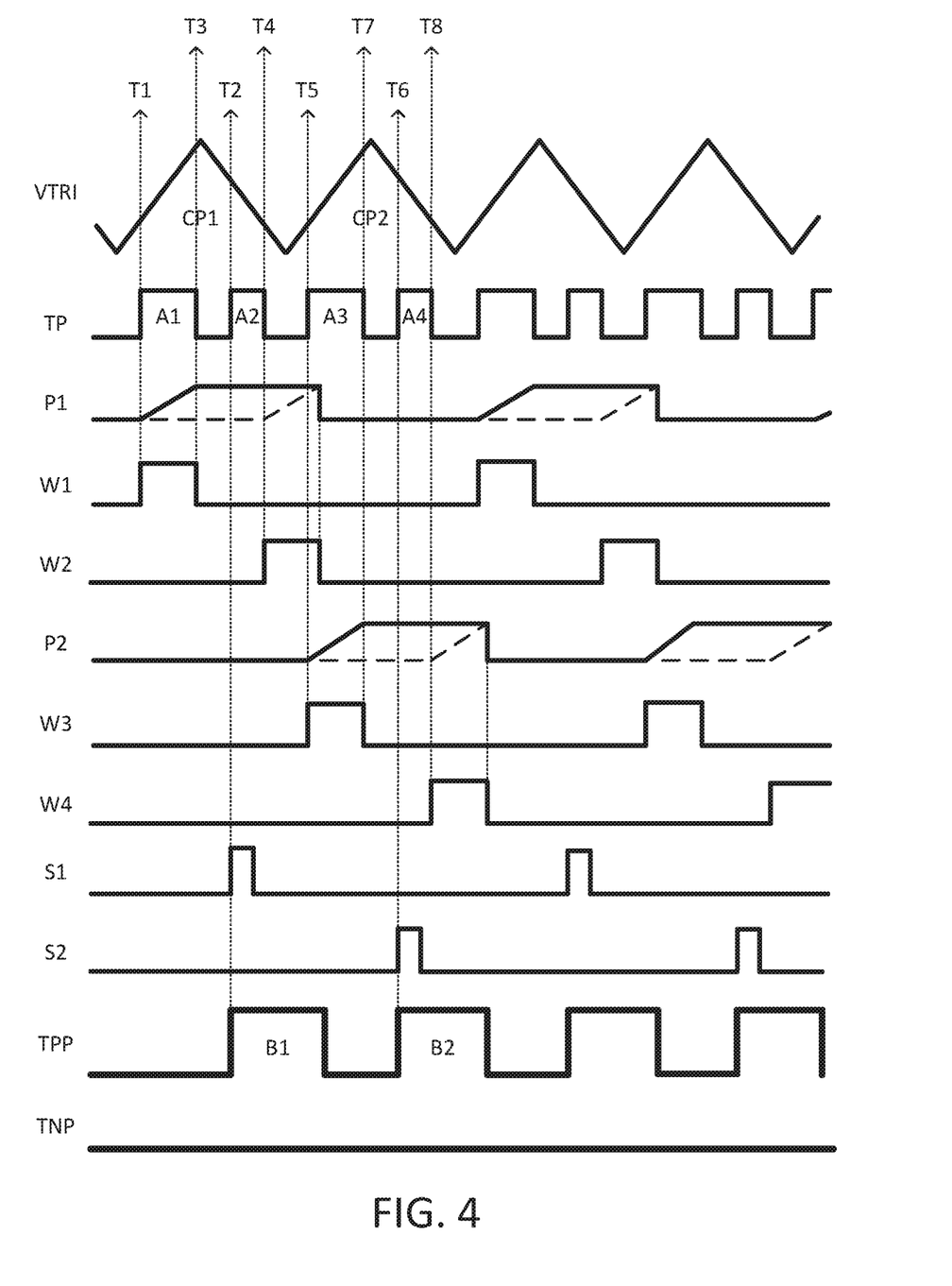
FIG. 4 depicts a schematic view of the signals processed and output by the electronic device according to one or more embodiments of the present disclosure.

Please refer to both FIG. 3 and FIG. 4. The electronic device 11 may comprise a sampling circuit 111 and a summing circuit 112. The summing circuit 112 may be coupled with the sampling circuit 111. The sampling circuit 111 may be configured to sample a pulse width of a pulse A1 of the T-mode signal TP since a time point T1 on a first half of a first pulse period of the triangle-wave signal VTRI. The summing circuit 112 may be configured to generate an output pulse B1 of the T-mode signal TPP since a second time point T2 on a second half of the first pulse period. The pulse width of the output pulse B1 may be a summation of the pulse widths of the pulse A1 and a pulse A2 of the T-mode signal TP. The pulse A2 is the next pulse after the pulse A1, as illustrated in FIG. 4.

The triangle-wave signal VTRI may be used as a kind of clock signal since its period may be consistent with the aforementioned clock signal CK_FSW. In the present embodiment, the first and second halves of the first pulse period may be the rising edge and falling edge of a pulse CP1 of the triangle-wave signal VTRI, respectively. However, the first and second halves of a "pulse period" does not necessarily mean the durations within a rising edge and a falling edge of the same pulse. In some embodiments, the first and second halves of a "pulse period" may refer to a falling edge of a first pulse and a rising edge of a second pulse that follows the first pulse.

As shown in FIG. 3, in some embodiments, the sampling circuit 111 may comprise a switch W1 and a capacitor C1 coupled with the switch W1. The summing circuit 112, on the other hand, may comprise a switch W2, a capacitor C2 coupled with the switch W2, a comparator M1 whose positive input and negative input are coupled with the capacitor C2 and the capacitor C1 respectively, and an set-reset (SR) flip-flop F1 whose set pin and reset pin are coupled with a source of a setting signal S1 and an output of the comparator M1, respectively.

A hypothetical signal P1 is illustrated in FIG. 4 to demonstrate the levels of the capacitors C1 (in solid line) and C2 (in dashed line). The sampling stage of the electronic device 11 may begin with turning on the switch W1 at the time point T1 such that the capacitor C1 is charged when the T-mode signal TP goes up to high level at the rising edge of the pulse A1. The capacitor C1 may keep being charged until the switch W1 is turned off at a time point T3 on the falling edge of the pulse A1. The pulse width of the pulse A1 may therefore be sampled via measuring the capacitor C1 charged.

Note that the time point T1 is not necessarily consistent with the rising edge of the pulse A1. However, the time point T1 (i.e., the switch W1 being turned on) should be no later than the rising edge of the pulse A1.

On the other hand, the summing stage of the electronic device 11 may begin with pulling up the T-mode signal TPP to the high level at the time point T2 via the summing circuit 112. More specifically, the setting signal S1 for the SR flip-flop F1 may go up to the high level in response to the rising edge of the pulse A2, and thus lead to the rising edge of the output pulse B1.

The switch W2 may be turned on at a time point T4 on a falling edge of the pulse A2 such that the capacitor C2 is charged. The T-mode signal TPP may remain on the high level until the switch W2 is turned off when the level of the capacitor C2 meets the level of the capacitor C1, as shown in the signal P1 where the dashed line and the solid line meet with each other. More specifically, the output of the comparator M1 may reach the high level when the level of the capacitor C2 meets the level of the capacitor C1, and said output may be used as an "R" signal for the SR flip-flop F1. Therefore, the output of the SR flip-flop F1 (i.e., the T-mode signal TPP) may be pulled down to low level as a consequence of reset.

Since the capacitors C1 and C2 are both charged to the same level by the same power source or two power sources that provide substantially the same current, the duration of the T-mode signal TPP being on the high level shall equal the summation of the pulse widths of the pulses A1 and A2 timewise. That is, the pulse widths of the pulses A1 and A2 may be combined as one even when the two pulses are asymmetric in width.

Similarly, the time point T2 is not necessarily the rising edge of the pulse A2. However, the time point T2 should be no later than the rising edge of the pulse A2.

In some embodiments, in addition to the set of sampling circuit 111 and summing circuit 112, the electronic device 11 may further comprise a second set of sampling circuit 121 and summing circuit 122. The summing circuit 122 may be coupled with the sampling circuit 121. Similar to the sampling circuit 111, the sampling circuit 121 may be configured to sample a pulse width of a pulse A3 of the T-mode signal TP since a time point T5 on a first half of a second pulse period of the triangle-wave signal VTRI. The second pulse period may follow the first pulse period mentioned above corresponding to the first set of sampling circuit 111 and summing circuit 112. That is, the first pulse period and the second pulse period may be consecutive in time.

Similar to the summing circuit 112, the summing circuit 122 may be configured to generate an output pulse B2 of the T-mode signal TPP since a second time point T6 on a second half of the second pulse period. The pulse width of the output pulse B2 may be a summation of the pulse widths of the pulse A3 and a pulse A4 of the T-mode signal TP. The pulse A4 is the next pulse after the pulse A3, as illustrated in FIG. 4. In these embodiments, the electronic device 11 may comprise an OR gate G1 coupling with the summing circuits 112 and 122, such that they jointly output the T-mode signal TPP.

Also similar to the sampling circuit 111 and summing circuit 112, the sampling circuit 121 may comprise a switch W3 and a capacitor C3 coupled with the switch W3, while the summing circuit 122, on the other hand, may comprise a switch W4, a capacitor C4 coupled with the switch W4, a comparator M2 whose positive input and negative input are coupled with the capacitor C4 and the capacitor C3 respectively, and an set-reset (SR) flip-flop F2 whose set pin and reset pin are coupled with a source of a setting signal S2 and an output of the comparator M2, respectively.

A hypothetical signal P2 is also illustrated in FIG. 4 to demonstrate the levels of the capacitors C3 (in solid line) and C4 (in dashed line). To sample the pulse width of the pulse A3, the switch W3 may be turned on at the time point T5 such that the capacitor C3 is charged when the T-mode signal TP goes up to high level at the rising edge of the pulse A3. The capacitor C3 may keep being charged until the switch W3 is turned off at a time point T7 on the falling edge of the pulse A3. The pulse width of the pulse A3 may therefore be sampled via measuring the capacitor C3 charged.

Note that the time point T5 is not necessarily consistent with the rising edge of the pulse A3. However, the time point T5 (i.e., the switch W3 being turned on) should be no later than the rising edge of the pulse A3.

To sum up the pulse widths of the pulses A3 and A4, the T-mode signal TPP may be pulled up to the high level at the time point T6 via the summing circuit 122. More specifically, the setting signal S2 for the SR flip-flop F2 may go up to the high level in response to the rising edge of the pulse A4, and thus lead to the rising edge of the output pulse B2.

The switch W4 may be turned on at a time point T8 on a falling edge of the pulse A4 such that the capacitor C4 is charged. The T-mode signal TPP may remain on the high level until the switch W4 is turned off when the level of the capacitor C4 meets the level of the capacitor C3, as shown in the signal P2 where the dashed line and the solid line meet with each other. More specifically, the output of the comparator M2 may reach the high level when the level of the capacitor C4 meets the level of the capacitor C3, and said output may be used as an "R" signal for the SR flip-flop F2. Therefore, the output of the SR flip-flop F2 (i.e., the T-mode signal TPP) may be pulled down to low level as a consequence of reset.

In some embodiments, the electronic device 11 may comprise a control circuit for generating control signals for turning on/off the switches W1-W4 according to the T-mode signal TP.

Like what happened to the capacitors C1 and C2, the duration of the T-mode signal TPP being on the high level shall equal the summation of the pulse widths of the pulses A3 and A4 timewise because the capacitors C3 and C4 are both charged to the same level by the same power source or two power sources that provide substantially the same current. That is, the pulse widths of the pulses A3 and A4 may be combined as one even when the two pulses are asymmetric in width.

The time point T6 is not necessarily the rising edge of the pulse A4. However, the time point T6 should be no later than the rising edge of the pulse A4.

The time point where the levels of the capacitors C1 and C2 meet may be later than the time point T5 (i.e., overlapping with the rising edge of the T-mode signal A3 timewise). However, this would not become a problem since the second set of sampling circuit 121 and summing circuit 122 can take care of the sampling and summing of pulses A3 and A4.

The T-mode signal TNP is also illustrated in FIG. 4 for ease of understanding. The T-mode signal TNP remains at the low level since the signals are used for ternary modulation. However, it should be noted that the T-mode signal TNP is not processed and/or output by the electronic device 11, but the electronic device 12. When the Q-mode signals QP and QN are opposite from the embodiments as described above, it is the electronic device 12 to perform the same function for the T-mode signal in negative rail derived from the Q-mode signal QN in the same way as the electronic device 11 does to the T-mode signal TP, and eventually achieve the same result (i.e., T-mode modulation with no double switching frequency issue, even with small pulse width of output signal and the delay mechanism).

As can be seen from FIG. 4, the switching frequency caused by the T-mode signals TPP and TNP is consistent with the clock signal (e.g., the triangle-wave signal VTRI or the previously mentioned clock signal CK_FSW). Accordingly, the double switching frequency issue can be avoided when the duty cycle is small.

In some embodiments, the aforementioned sampling and summing circuits as well as the OR gate and/or the control circuit may be integrated into one or more audio signal processors.

Figure 5:
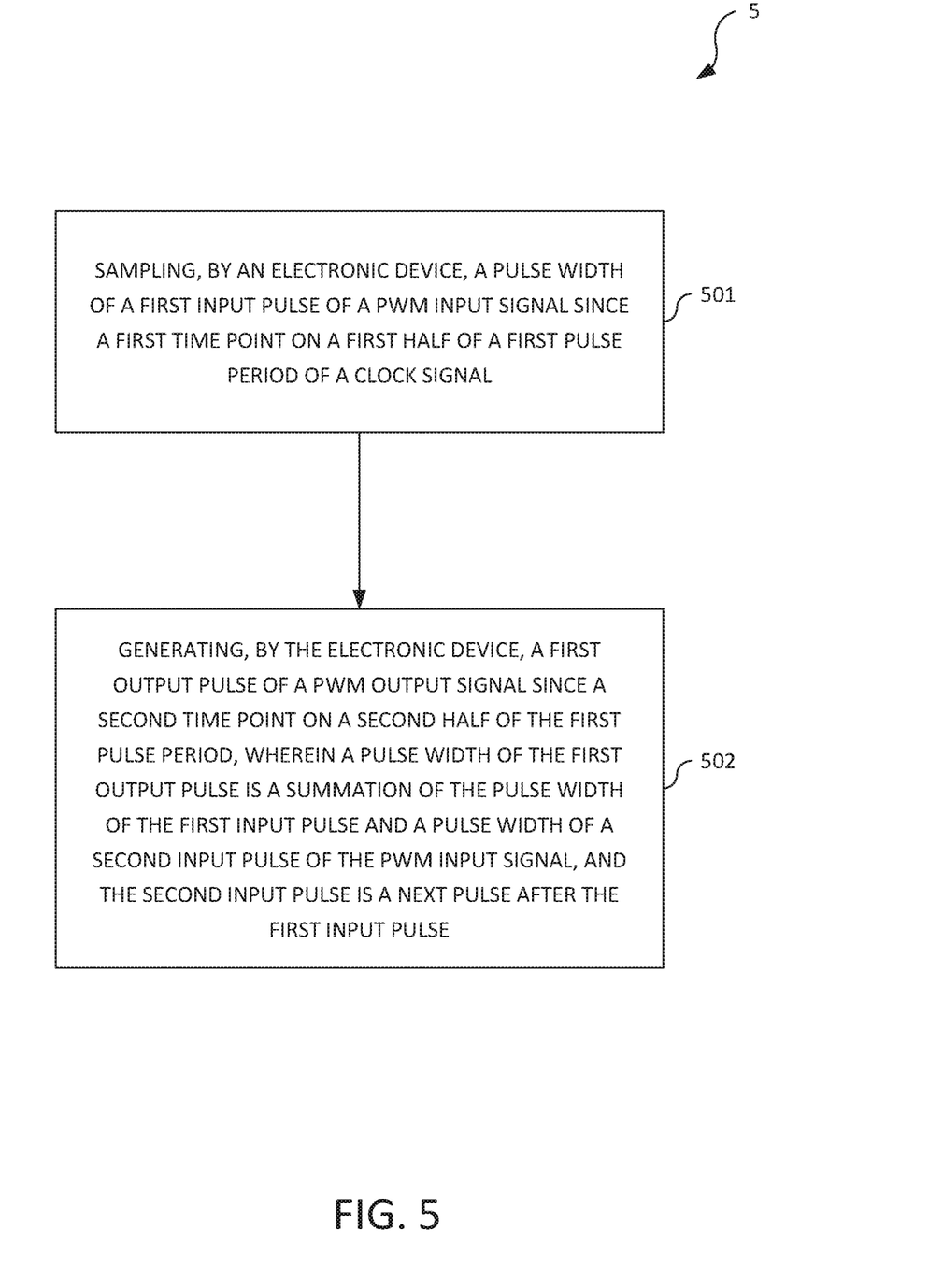
FIG. 5 depicts a method for audio signal processing according to one or more embodiments of the present disclosure.

FIG. 5 depicts a method for audio signal processing according to one or more embodiments of the present disclosure. Please refer to FIG. 5. A method 5 for audio signal processing may comprise steps as follows:
  (A) sampling, by an electronic device, a pulse width of a first input pulse of a PWM input signal since a first time point on a first half of a first pulse period of a clock signal (labeled as step 501); and
  (B) generating, by the electronic device, a first output pulse of a PWM output signal since a second time point on a second half of the first pulse period, wherein a pulse width of the first output pulse is a summation of the pulse width of the first input pulse and a pulse width of a second input pulse of the PWM input signal, and the second input pulse is a next pulse after the first input pulse (labeled as step 502).

In some embodiments, regarding the method 5, the electronic device may comprise a first switch and a first capacitor coupled with the first switch, and the step (A) may further comprise steps as follows:
  turning on, by the electronic device, the first switch at the first time point on a rising edge of the first input pulse such that the first capacitor is charged; and
  turning off, by the electronic device, the first switch at a third time point on a falling edge of the first input pulse, thereby sampling the pulse width of the first input pulse via the first capacitor.

In some embodiments, regarding the method 5, the electronic device may comprise a first switch, a first capacitor coupled with the first switch, a second switch, a second capacitor coupled with the second switch, a first comparator, and a first SR flip-flop. A positive input and a negative input of the first comparator may be respectively coupled with the second capacitor and the first capacitor. A set pin and a reset pin of the first SR flip-flop may be respectively coupled with a source of the PWM input signal and an output of the first comparator. The step (A) may further comprise steps as follows: turning on, by the electronic device, the first switch at the first time point on a rising edge of the first input pulse such that the first capacitor is charged; and turning off, by the electronic device, the first switch at a third time point on a falling edge of the first input pulse, thereby sampling the pulse width of the first input pulse via the first capacitor. Moreover, the step (B) may further comprise steps as follows: turning on, by the electronic device, the second switch at a fourth time point on a falling edge of the second input pulse such that the second capacitor is charged; and turning off, by the electronic device, the second switch when a level of the second capacitor meets a level of the first capacitor, such that the first SR flip-flop outputs the first output pulse.

In some embodiments, regarding the method 5, the pulse width of the first input pulse may be different with the pulse width of the second input pulse.

In some embodiments, the method 5 may further comprise steps as follows:
  (C) sampling, by the electronic device, a pulse width of a third input pulse of the PWM input signal since a fifth time point on a first half of a second pulse period of the clock signal; and
  (D) generating, by the electronic device, a second output pulse of the PWM output signal since a sixth time point on a second half of the second pulse period, wherein the second pulse period follows the first pulse period, and a pulse width of the second output pulse is a summation of the pulse width of the third input pulse and a pulse width of a fourth input pulse of the PWM input signal, the fourth input pulse being a next pulse after the third input pulse.

In some embodiments, regarding the method 5, the electronic device may comprise a third switch and a third capacitor coupled with the third switch. Moreover, the method 5 may further comprise steps as follows:
  (C) sampling, by the electronic device, a pulse width of a third input pulse of the PWM input signal since a fifth time point on a first half of a second pulse period of the clock signal via performing steps as follows: turning on, by the electronic device, the third switch at the fifth time point such that the third capacitor is charged; and turning off, by the electronic device, the third switch at a seventh time point on a falling edge of the third input pulse, thereby sampling the pulse width of the third input pulse via the third capacitor; and
  (D) generating, by the electronic device, a second output pulse of the PWM output signal since a sixth time point on a second half of the second pulse period, wherein the second pulse period follows the first pulse period, and a pulse width of the second output pulse is a summation of the pulse width of the third input pulse and a pulse width of a fourth input pulse of the PWM input signal, the fourth input pulse being a next pulse after the third input pulse.

In some embodiments, regarding the method 5, the electronic device may comprise a fourth switch, a fourth capacitor coupled with the fourth switch, a second comparator whose positive input and negative input are respectively coupled with the fourth capacitor and the third capacitor, and a second SR flip-flop whose set pin and reset pin are respectively coupled with a source of the PWM input signal and an output of the second comparator. Moreover, the method 5 may further comprise steps as follows:
  (C) sampling, by the electronic device, a pulse width of a third input pulse of the PWM input signal since a fifth time point on a first half of a second pulse period of the clock signal; and
  (D) generating, by the electronic device, a second output pulse of the PWM output signal since a sixth time point on a second half of the second pulse period via performing steps as follows: turning on, by the electronic device, the fourth switch at an eighth time point on a falling edge of the fourth input pulse such that the fourth capacitor is charged; and turning off, by the electronic device, the fourth switch when a level of the fourth capacitor meets a level of the third capacitor, such that the second SR flip-flop outputs the second output pulse. The second pulse period follows the first pulse period, and a pulse width of the second output pulse is a summation of the pulse width of the third input pulse and a pulse width of a fourth input pulse of the PWM input signal, the fourth input pulse being a next pulse after the third input pulse.

Each embodiment of the method 5 basically corresponds to a certain embodiment of the electronic device 11. Therefore, those of ordinary skill in the art may fully understand and implement all the corresponding embodiments of the method 5 simply by referring to the above descriptions of the electronic device 11, even though not all of the embodiments of the method are described in detail above.

The above disclosure is related to the detailed technical contents and inventive features thereof. People of ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

The invention claimed is:

1. An electronic device, comprising:
   a first sampling circuit, being configured to sample a pulse width of a first input pulse of a pulse-width modulated (PWM) input signal since a first time point on a first half of a first pulse period of a clock signal; and
   a first summing circuit coupled with the first sampling circuit, being configured to generate a first output pulse of a PWM output signal since a second time point on a second half of the first pulse period, wherein a pulse width of the first output pulse is a summation of the pulse width of the first input pulse and a pulse width of a second input pulse of the PWM input signal, and the second input pulse is a next pulse after the first input pulse.

2. The electronic device of claim 1, wherein the first sampling circuit comprises a first switch and a first capacitor coupled with the first switch, the first switch being turned on at the first time point such that the first capacitor is charged, and the first switch being turned off at a third time point on a falling edge of the first input pulse, thereby sampling the pulse width of the first input pulse via the first capacitor.

3. The electronic device of claim 2, wherein the first summing circuit comprises:
   a second switch;
   a second capacitor coupled with the second switch;
   a first comparator whose positive input and negative input are coupled with the second capacitor and the first capacitor respectively; and
   a first set-reset (SR) flip-flop whose set pin and reset pin are coupled with a source of a first setting signal and an output of the first comparator respectively, wherein the first setting signal goes up to a high level in response to a rising edge of the second input pulse;
   wherein the second switch is turned on at a fourth time point on a falling edge of the second input pulse such that the second capacitor is charged, and the second switch is turned off when a level of the second capacitor meets a level of the first capacitor, such that the first SR flip-flop outputs the first output pulse.

4. The electronic device of claim 1, wherein the pulse width of the first input pulse is different than the pulse width of the second input pulse.

5. The electronic device of claim 1, further comprising:
   a second sampling circuit, being configured to sample a pulse width of a third input pulse of the PWM input signal since a fifth time point on a first half of a second pulse period of the clock signal, wherein the second pulse period follows the first pulse period;
   a second summing circuit coupled with the second sampling circuit, being configured to generate a second output pulse of the PWM output signal since a sixth time point on a second half of the second pulse period, wherein the second output pulse is a next pulse after the first output pulse, and a pulse width of the second output pulse is a summation of the pulse width of the third input pulse and a pulse width of a fourth input pulse of the PWM input signal, the fourth input pulse being a next pulse after the third input pulse; and
   an OR gate, wherein the first summing circuit and the second summing circuit are coupled with the OR gate to jointly output the PWM output signal.

6. The electronic device of claim 5, wherein the second sampling circuit comprises a third switch and a third capacitor coupled with the third switch, the third switch being turned on at the fifth time point such that the third capacitor is charged, and being turned off at a seventh time point on a falling edge of the third input pulse, thereby sampling the pulse width of the third input pulse via the third capacitor.

7. The electronic device of claim 6, wherein the second summing circuit comprises:
   a fourth switch;
   a fourth capacitor coupled with the fourth switch;
   a second comparator whose positive input and negative input are coupled with the fourth capacitor and the third capacitor respectively; and
   a second set-reset (SR) flip-flop whose set pin and reset pin are coupled with a source of a second setting signal and an output of the second comparator respectively, wherein the second setting signal goes up to a high level in response to a rising edge of the fourth input pulse;
   wherein the fourth switch is turned on at an eighth time point on a falling edge of the fourth input pulse such that the fourth capacitor is charged, and the fourth switch is turned off when a level of the fourth capacitor meets a level of the third capacitor, such that the second SR flip-flop outputs the second output pulse.

8. A method for audio signal processing, comprising steps as follows:
   (A) sampling, by an electronic device, a pulse width of a first input pulse of a pulse-width modulated (PWM) input signal since a first time point on a first half of a first pulse period of a clock signal; and
   (B) generating, by the electronic device, a first output pulse of a PWM output signal since a second time point on a second half of the first pulse period, wherein a pulse width of the first output pulse is a summation of the pulse width of the first input pulse and a pulse width of a second input pulse of the PWM input signal, and the second input pulse is a next pulse after the first input pulse.

9. The method of claim 8, wherein the electronic device comprises a first switch and a first capacitor coupled with the first switch, and the step (A) further comprises steps as follows:

turning on, by the electronic device, the first switch at the first time point on a rising edge of the first input pulse such that the first capacitor is charged; and turning off, by the electronic device, the first switch at a third time point on a falling edge of the first input pulse, thereby sampling the pulse width of the first input pulse via the first capacitor.

10. The method of claim 9, wherein the electronic device further comprises a second switch, a second capacitor coupled with the second switch, a first comparator, and a first set-reset (SR) flip-flop, a positive input and a negative input of the first comparator being respectively coupled with the second capacitor and the first capacitor, a set pin and a reset pin of the first SR flip-flop being respectively coupled with a source of a first setting signal and an output of the first comparator, and the step (B) further comprises steps as follows:

turning on, by the electronic device, the second switch at a fourth time point on a falling edge of the second input pulse such that the second capacitor is charged; and turning off, by the electronic device, the second switch when a level of the second capacitor meets a level of the first capacitor, such that the first SR flip-flop outputs the first output pulse.

11. The method of claim 8, wherein the pulse width of the first input pulse is different than the pulse width of the second input pulse.

12. The method of claim 8, further comprising steps as follows:

(C) sampling, by the electronic device, a pulse width of a third input pulse of the PWM input signal since a fifth time point on a first half of a second pulse period of the clock signal; and (D) generating, by the electronic device, a second output pulse of the PWM output signal since a sixth time point on a second half of the second pulse period, wherein the second pulse period follows the first pulse period, and a pulse width of the second output pulse is a summation of the pulse width of the third input pulse and a pulse width of a fourth input pulse of the PWM input signal, the fourth input pulse being a next pulse after the third input pulse.

13. The method of claim 12, wherein the electronic device comprises a third switch and a third capacitor coupled with the third switch, and the step (C) further comprises steps as follows:

turning on, by the electronic device, the third switch at the fifth time point such that the third capacitor is charged; and turning off, by the electronic device, the third switch at a seventh time point on a falling edge of the third input pulse, thereby sampling the pulse width of the third input pulse via the third capacitor.

14. The method of claim 13, wherein the electronic device further comprises a fourth switch, a fourth capacitor coupled with the fourth switch, a second comparator whose positive input and negative input are respectively coupled with the fourth capacitor and the third capacitor, and a second set-reset (SR) flip-flop whose set pin and reset pin are respectively coupled with a source of a second setting signal and an output of the second comparator, and the step (D) further comprises steps as follows:

turning on, by the electronic device, the fourth switch at an eighth time point on a falling edge of the fourth input pulse such that the fourth capacitor is charged; and turning off, by the electronic device, the fourth switch when a level of the fourth capacitor meets a level of the third capacitor, such that the second SR flip-flop outputs the second output pulse.

\* \* \* \* \*